United States Patent
Dutoya et al.

(10) Patent No.: US 7,627,400 B2
(45) Date of Patent: Dec. 1, 2009

(54) METHOD AND DEVICE FOR DETECTING ELECTRIC ARC PHENOMENON ON AT LEAST ONE ELECTRIC CABLE

(75) Inventors: Michel Dutoya, Toulouse (FR); Gilles Mazeau, Blagnac (FR); Christophe Vlacich, Toulouse (FR)

(73) Assignee: AIRBUS France, Toulouse (FR)

( * ) Notice: Subject to any disclaimer, the term of this patent is extended or adjusted under 35 U.S.C. 154(b) by 327 days.

(21) Appl. No.: 11/576,191

(22) PCT Filed: Sep. 28, 2005

(86) PCT No.: PCT/FR2005/002394

§ 371 (c)(1),
(2), (4) Date: Mar. 28, 2007

(87) PCT Pub. No.: WO2006/037874

PCT Pub. Date: Apr. 13, 2006

(65) Prior Publication Data

US 2008/0033602 A1    Feb. 7, 2008

(30) Foreign Application Priority Data

Oct. 1, 2004    (FR) .................................. 04 10384

(51) Int. Cl.
*G01R 31/08* (2006.01)
*H01H 9/50* (2006.01)

(52) U.S. Cl. .................... 700/293; 324/536; 702/58

(58) Field of Classification Search ............... 700/292, 700/293, 294; 324/536; 702/58, 66, 71, 702/73; 361/2, 7
See application file for complete search history.

(56) References Cited

U.S. PATENT DOCUMENTS

| | | | |
|---|---|---|---|
| 6,772,077 B1 | 8/2004 | Parker et al. | |
| 7,307,820 B2 * | 12/2007 | Henson et al. | ............ 361/42 |
| 2002/0118022 A1 * | 8/2002 | Dring et al. | ............ 324/536 |
| 2003/0137309 A1 * | 7/2003 | Itimura et al. | ............ 324/536 |
| 2004/0156153 A1 | 8/2004 | Csanky et al. | |

FOREIGN PATENT DOCUMENTS

| | | |
|---|---|---|
| DE | 19640340 | 4/1998 |
| EP | 0537066 | 4/1993 |
| WO | 9612969 | 5/1996 |

OTHER PUBLICATIONS

International Search Report dated Feb. 14, 2006 with English translation.

Anonymous, "Algorithms—Discriminant Analysis, Mahalanobis Distance," Internet Article, Online, XP002328676, http://www.thermo.com/com/cda/resources/resources_detail/1,2166,13324,00.html?fromPage=search&keyword=mahalanobis>, retrieved May 18, 2005, 3 pages total.

* cited by examiner

*Primary Examiner*—Ryan A Jarrett
(74) *Attorney, Agent, or Firm*—Dickinson Wright, PLLC

(57) ABSTRACT

A method and device for detecting an electrical arcing phenomenon operate to measure an electric current and an electric voltage on an electric cable. The measurements are filtered and the filtered measurements are digitized to produce two digitized data segments. Each of the two segments is subjected to a number of functions to produce a form vector. The membership class of the form vector is determined, and the presence or absence of an electric arcing phenomenon is determined from the membership class.

14 Claims, 2 Drawing Sheets

METHOD AND DEVICE FOR DETECTING ELECTRIC ARC PHENOMENON ON AT LEAST ONE ELECTRIC CABLE

FIELD OF THE INVENTION

The present invention concerns a method and a device for detecting an electrical arcing phenomenon on an electrical cable, for example a cable forming part of a bundle of electrical cables.

BACKGROUND OF THE RELATED ART

It is known that an electrical arcing phenomenon is the result of slow deterioration of the insulation of cables used to distribute alternating current or direct current electrical energy caused by an aggressive environment (moisture in the air, mildew, rubbing, vibration of the connecting terminals, varying temperatures, shear, etc.).

The electrical arcing phenomenon is divided into four successive phases of increasing energy:
  a corona discharge phase corresponding to the birth of the phenomenon;
  a single-alternation conduction phase corresponding to a dielectric breakdown with an increase of intensity;
  a double-alternation conduction phase; and
  an arc tracking phase. This last phase is a phase of electrical discharge of limited intensity propagating along electrical cables which may lead to the partial or total destruction of a bundle of electrical cables as a result of carbonization of the cable insulation.

Apart from deterioration of the insulation of an electrical cable, a loosened connection and abrasion of a cable are also propitious to the appearance of electrical arcs.

SUMMARY

An object of the present invention is to detect an electrical arcing phenomenon in order to be able to avoid the harmful consequences thereof cited above.

There are known in the art protection devices called thermal cut-outs that provide what is called "overcurrent" protection. However, the usual thermal cut-outs, which protect power supply cables if the energy consumed by the connected load exceeds its nominal value, are unsuitable for protection against arcing phenomena because of the low intensity at which the arc discharge phenomena occur and propagate over an electrical network, that low intensity being insufficient to trigger said thermal cut-outs.

An object of the present invention is to remedy these drawbacks. The present invention concerns a method of detecting an electrical arcing phenomenon on at least one electrical cable, for example a cable forming part of a bundle of electrical cables, as soon as possible and in a particularly efficacious manner.

To this end, according to the invention, said method is noteworthy in that:
  A/ in a preliminary step, there is determined a database comprising a plurality of classes, including a first class relating to a corona discharge phase to be detected and at least one second class relating to phenomena liable to interfere with the detection process; and
  B/ in a subsequent detection step, successively:
    a) in an acquisition phase:
      α) an electrical current measurement and an electrical voltage measurement are carried out directly on said electrical cable;
      β) said current and voltage measurements obtained in this way are filtered; and
      γ) the measurements filtered in this way are digitized to form two digitized data segments relating to the electrical current and to the electrical voltage, respectively; and
    b) in a subsequent processing phase:
      α) each of said segments is subjected to a plurality of particular functions each generating a scalar magnitude, the set of scalar magnitudes relating to the current forming a first vector and the set of scalar magnitudes relating to the voltage forming a second vector;
      β) using said database and a shape vector obtained from said first and second vectors that is representative of the measurements carried out, the class to which said shape vector belongs is determined; and
      γ) it is concluded that:
        an electrical arcing phenomenon exists if said class represents said first class relating to a corona discharge phase; and
        there is no electrical arcing phenomenon otherwise.

Accordingly, thanks to the invention, it is possible to detect efficaciously an electrical arcing phenomenon occurring on any type of electrical cable or bundle of electrical cables and in particular a cable or a bundle of cables installed on an aircraft, for example an airliner.

Moreover, by detecting a corona discharge phase, it is possible to detect an electrical arcing phenomenon as soon as it arises (as indicated above, the corona discharge phase corresponds to the onset of the electrical arcing phenomenon), so that it is possible to take in good time all the measures necessary to prevent arc tracking and the harmful consequences thereof cited above.

It will further be noted that the protection provided by the invention may be provided in conjunction with the usual "overcurrent" thermal protection.

The corona discharge phase that the present invention takes into account is characterized by:
  low energy;
  a band of high frequencies separate from and independent of the mains frequency;
  random amplitude, frequency and period; and
  simultaneous effect on the voltage and the current.

The detection of a corona discharge phase is complex, in particular because of its random characteristics. Moreover, in an aeronautical environment, i.e. when the cables under surveillance are installed on an aircraft, they are subjected to many kinds of high-intensity external electromagnetic attack (e.g. lightning) and low-intensity electromagnetic attack (e.g. radar). As the corona discharge phenomenon is of low intensity, electromagnetic attack could degrade detection quality and reliability and generate false triggering. Moreover, each electrical cable supplies a non-linear load generating distortions and creating high-frequency harmonics (computer, landing lights, etc.) that could also potentially pollute the detection process. However, thanks to the invention, it is possible to eliminate these risks by taking account of classes to which the phenomena (in particular electromagnetic phenomena and loads) that are liable to interfere with the detection process belong, and by discriminating between the corona discharges to be detected and these disturbing phenomena.

In one particular embodiment:

in the step B.a.α the current and voltage measurements are carried out in a synchronized fashion, in order to preserve the phase relationship between the current and the voltage; and/or in the step B.a.β band-pass filtering is effected, in order to eliminate the information relating to the power supply network; and the particular functions used in the step B.b.α have the object of extracting interpretable main components of the signal (shape vector) for comparison with said database; and/or said shape vector is obtained by concatenation of said first and second vectors.

In a preferred embodiment, in the step B.b.β there are determined probabilities of said shape vector belonging to respective classes of said database and in the step B.b.γ it is concluded that an electrical arcing phenomenon exists if at least the following condition is satisfied: the probability of belonging to said first class is higher than the probabilities thus determined.

In this case, the probabilities are determined advantageously with the aid of a Bayesian decision.

Moreover, in the step B.b.γ it is advantageously concluded that an electrical arcing phenomenon exists if the following conditions are also satisfied:

the probability of belonging to said first class is above an ambiguity threshold;

a probability density is greater than a predetermined value; and a Mahalanobis distance is less than a predetermined value.

Moreover, in the step B.b.β it is advantageous if:

said shape vector is projected into a sub-space to obtain a representative point having a reduced number of main components; and this point is projected into spaces representing the classes of the database to obtain the corresponding probabilities of this point belonging to said classes that is representative of the shape vector.

Moreover, said database is advantageously formed by a training process in said preliminary step. Said database is advantageously formed from measurements carried out on electrical cables subject to phenomena for which it is required to constitute classes by implementation of at least said steps B.a.α, B.a.β, B.a.γ and B.b.α.

The present invention also concerns a device for detecting an electrical arcing phenomenon on at least one electrical cable, characterized in that it includes at least:

a database comprising a plurality of classes including a first class relating to a corona discharge phase to be detected and at least one second class relating to phenomena liable to interfere with the detection process, first means for carrying out an electrical current measurement and an electrical voltage measurement directly on said electrical cable;

second means for filtering said current and voltage measurements;

third means for digitizing the filtered measurements to form two digitized data segments relating to the electrical current and to the electrical voltage, respectively;

fourth means for subjecting each of said segments to a plurality of particular functions each generating a scalar magnitude, the set of scalar magnitudes relating to the current forming a first vector and the set of scalar magnitudes relating to the voltage forming a second vector;

fifth means for determining the class to which a shape vector obtained from said first and second vectors and representative of the measurements carried out by said first means belongs using said database; and means for deducing the existence or non-existence of an electrical arcing phenomenon from the result of the processing carried out by said fifth means.

Furthermore, in one particular embodiment, said device further includes:

electrical power supply means connected to said electrical cable that is being monitored and supplied with electrical power thereby, avoiding having to provide a specific electrical power supply for the detector device; and/or a switching unit adapted to interrupt the current supplied by said electrical cable that is being monitored automatically in the event of detection of an electrical arcing phenomenon. Thus the device according to the invention operates as a circuit-breaker.

The device conforming to the invention has numerous advantages. In particular:

it detects in real time each arcing phenomenon that occurs on any type of electrical cable as soon as that phenomenon arises;

it increases the reliability of the decision-making process and therefore limits the probability of false alarms;

it increases the sensitivity of electrical arcing detection and therefore protects the integrity of the electrical network; and it immunizes the protection function from disturbing phenomena.

BRIEF DESCRIPTION OF THE DRAWINGS

The figures of the appended drawings show how the invention may be reduced to practice. In these figures, identical reference numbers designate similar items.

DETAILED DESCRIPTION

Figure 1:
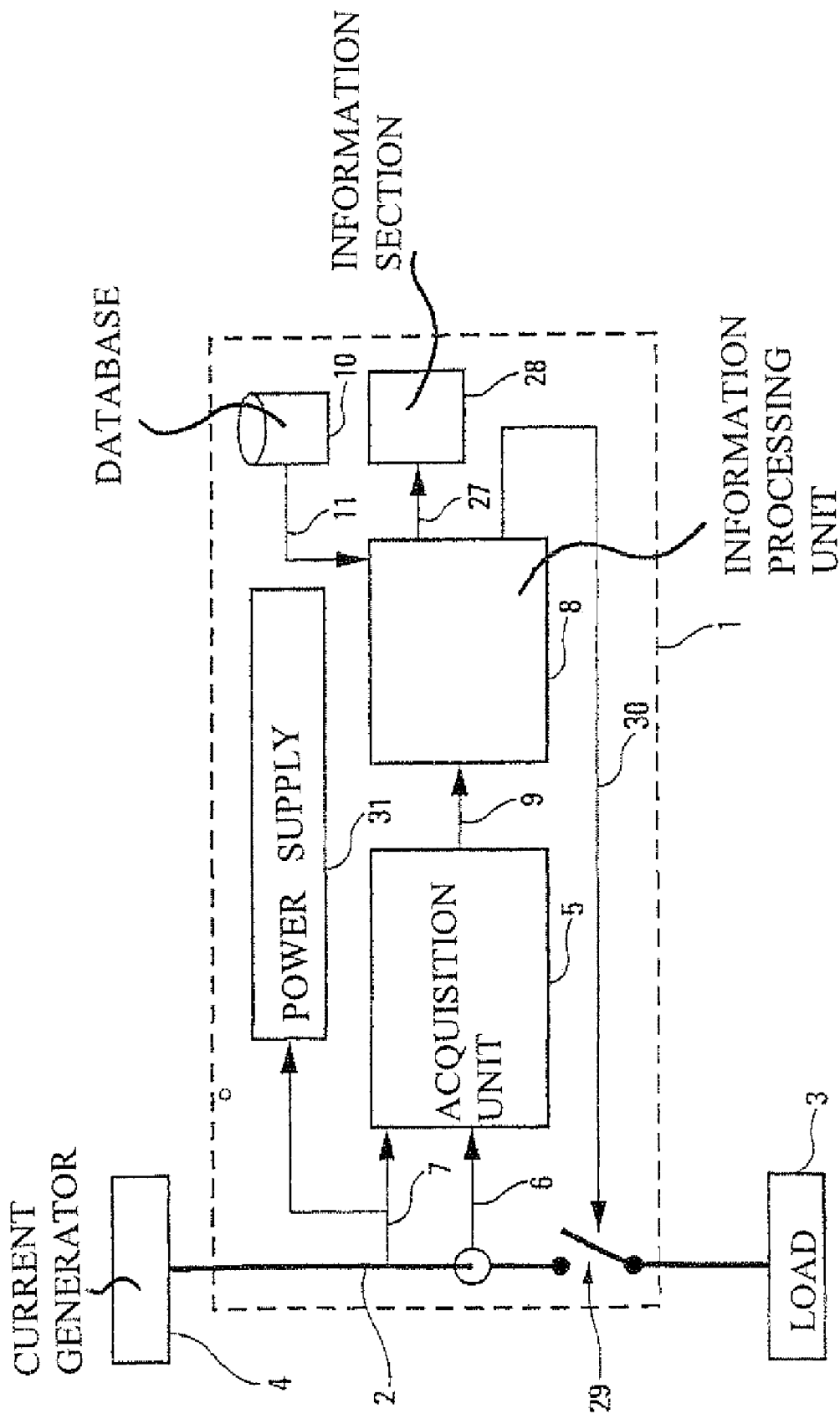
FIG. 1 is a block schematic of a device of the invention.

The device 1 of the invention shown schematically in FIG. 1 is for detecting an electrical arcing phenomenon on at least one electrical cable 2 forming part of a bundle of electrical cables, for example, before the electrical arc tracking that could lead to the partial or total destruction of a bundle of electrical cables, in order in particular:

to increase safety;

to limit the consequences of an electrical discharge; and if the cable under surveillance is installed on aircraft, in particular an airliner, to protect the integrity of adjacent cables without compromising the availability of the aircraft. In this latter case, the device 1 is an onboard device.

Said electrical cable 2 that is being monitored is used to connect a load 3 of the usual kind to an electrical current generator 4 in the usual way.

According to the invention, said device 1 includes:

an acquisition unit 5 that is connected by connections 6 and 7 to said electrical cable 2;

an information processing unit 8 that is connected by a connection 9 to said acquisition unit 5; and a database 10 that is connected by a connection 11 to said information processing unit 8. This database 10 comprises a plurality of classes C1, C2, C3 of which a first class C1 relates to a corona discharge phase (see below)

to be detected and classes C2 and C3 relate to phenomena liable to interfere with the detection process; in particular class C2 relates to low-intensity electromagnetic attacks (radar fields, etc) and class C3 relates to loads. Said database 10 is formed by a training process during a preliminary step as described hereinafter.

The corona discharge phase taken into account by the present invention is characterized by:

low energy;

a band of high frequencies separate from and independent of the mains frequency;

random amplitude, frequency and period; and simultaneous effect on the voltage and the current.

Figure 2:
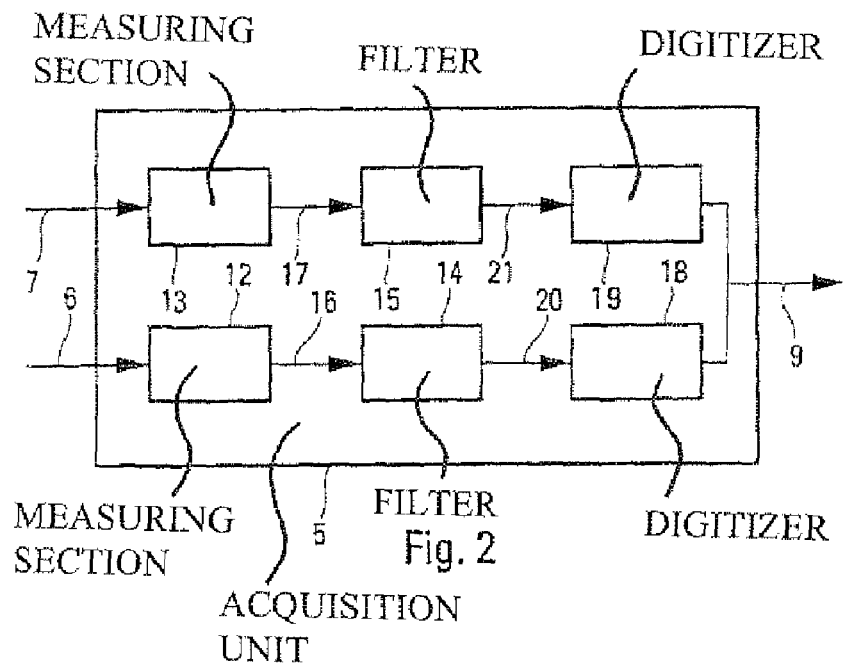
FIGS. 2 and 3 are more detailed schematics of processing means of a device of the invention.

As shown in FIG. 2, said acquisition unit 5 of the invention includes:

measuring means 12 and 13 of the usual kind connected to said connections 6 and 7, respectively to measure directly the electrical current in and the electrical voltage on said electrical cable 2;

filter means 14 and 15 connected by respective connections 16 and 17 to said measuring means 12 and 13 and adapted to filter said current and voltage measurements; and means 18 and 19 connected by respective connections 20 and 21 to said filter means 14 and 15 and adapted to digitize the measurements filtered by said filter means 14 and 15 to form two digitized data segments relating to the electrical current and to the electrical voltage, respectively.

In one particular embodiment:

said measuring means 12 and 13 carry out synchronized current and voltage measurements simultaneously in order to protect the time relationship between the current and the voltage. The voltage and the current are sampled with a shaping stage on the phase that is being monitored; and said filter means 14 and 15 apply band-pass filtering, for example by means of a Fourier transform, in order to eliminate information relating to the power supply network (current generator 4); the filtering function extracts the spectral components representative of the phenomena to be detected.

Figure 3:
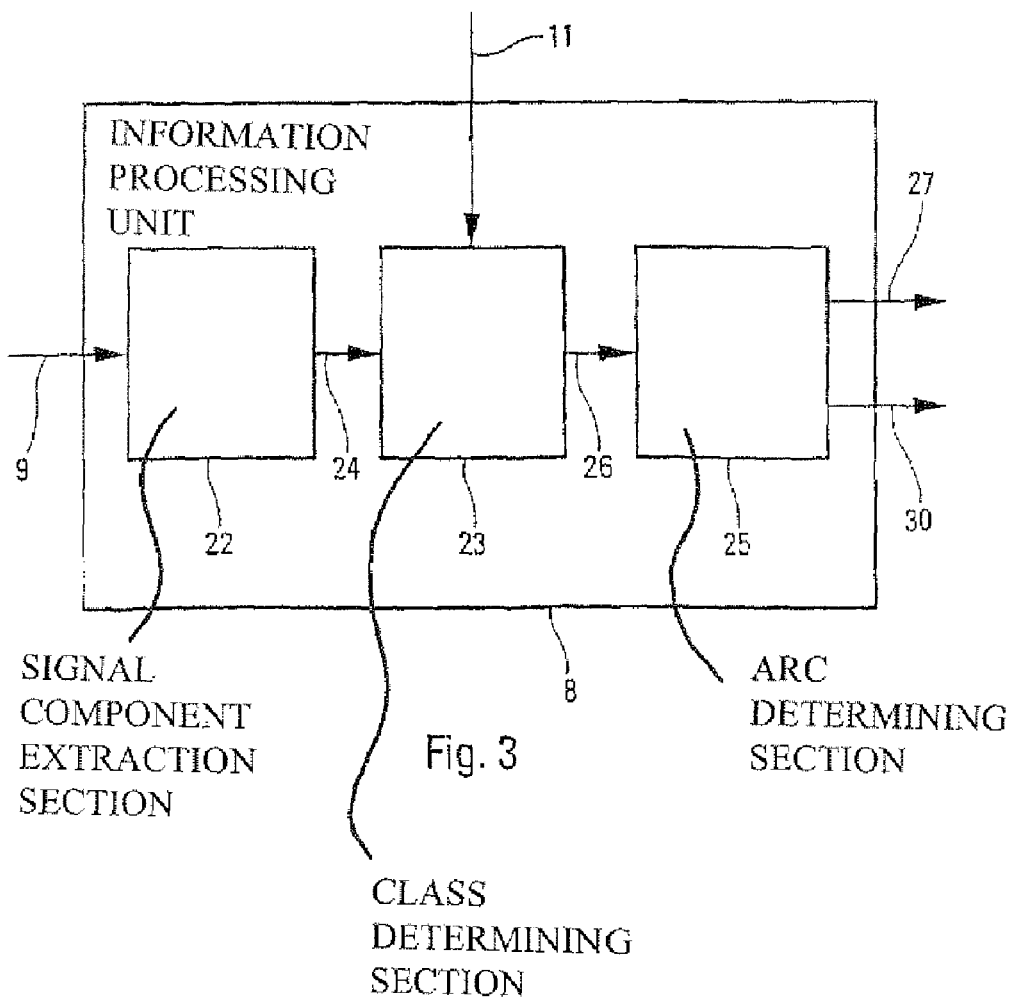

Moreover, as represented in FIG. 3, said information processing unit 8 of the invention includes at least:

means 22 connected to the connection 9 which include a plurality of particular integrated functions and are adapted to subject each of said digitized data segments received from said means 18 and 19 to said plurality of particular functions. Each of said particular functions supplies at the output a scalar magnitude. The set of scalar magnitudes relating to the current then forms a first vector and the set of scalar magnitudes relating to the voltage forms a second vector. The object of said particular functions is to extract the main components of the signal that can be interpreted (shape vector) for comparison with the database 10;

means 23 connected by a connection 24 to said means 22, for determining the class to which a shape vector belongs, using information coming from said database 10 and received via the connection 11 and the shape vector obtained from said first and second vectors and representative of the measurements effected by said measuring means 12 and 13 on said electrical cable 2. This shape vector is therefore representative of the electrical state of said cable 2. More precisely, said shape vector is obtained by concatenation of said first and second vectors determined by the means 22; and means 25 connected by a connection 26 to said means 23 for deducing from the result of the processing carried out by said means 23 the existence or non-existence of an electrical arcing phenomenon at the level of said electrical cable 2.

More precisely:

said means 23 determine probabilities of said shape vector belonging to the classes C1, C2 and C3 of said database 10; and said means 25 conclude that an electrical arcing phenomenon exists if at least the following condition is satisfied: the probability of belonging to said class C1 (relating to the corona discharge phase) is the highest of the probabilities determined by said means 23.

As indicated above, the digitized data is recovered and processed segment by segment. The device 1 therefore has two periodic measurement segments (one for the current and one for the voltage). Said device 1 determines if a corona discharge or corona discharge phase is present from the mathematical combination of these two segments. The mathematical approach consists in effecting a classification of the current and voltage measurements for the phase under scrutiny. The general idea is to extract the maximum information from the physical phenomenon in order to be able to characterize it in amplitude, frequency and time. Several mathematical algorithms are used to dissect the physical signal on the basis of the measurement segments. Each algorithm has its own transfer function. The means 23 use the combination of all these results for shape recognition (see below).

Said means 23 function as classification means. To this end they use said shape vector characterizing the voltage and the current of the phase under scrutiny and said database 10 representing the phenomena to be detected. The shape vector is projected into a subspace in order to reduce the number of main components of the shape vector. The point at the reduced coordinates obtained in this way is then projected into shape spaces representing said classes C1, C2 and C3 of the database 10.

It will be noted that a main component analysis (reducing the total number of components) calculates the degree of redundancy between variables describing the behavior of a phenomenon. An analysis of this kind changes from a space with "m" dimensions to a space with "p" dimensions, where "m">"p". A study of the degree of redundancy between variables enables the components (variables) to be sorted into size order. After processing, the analysis supplies a matrix for passing between the space with "m" dimensions and the space with "p" dimensions. For example, at the beginning of the analysis there are six components (or variables) describing the three phenomena cited above (corona discharges, electromagnetic interference, loads).

Said means 23 determine the probabilities of belong to a class cited above with the aid of a Bayesian decision.

The Bayesian decision is based on a normal probability law, i.e. each class is modeled by a Gaussian distribution whose culminating point (epicenter) corresponds to the mean of the shape vectors. The measuring point that is projected into the plane of the database is subject to the following calculations:

the distance between this measuring point and the epicenter of the class C1;

the distance between this measuring point and the epicenter of the class C2; and the distance between this measuring point and the epicenter of the class C3.

This kind of measurement is called a Mahalanobis distance measurement. When all the distances have been calculated, Bayes' theorem is used to determine the a posteriori probability of belong to each of the classes C1, C2, C3. Only the maximum a posteriori probability is acted on.

This Bayesian decision is based on the following characteristics:

A/ calculation of the a posteriori Bayes' probability:

$$P(w_i/Z) = \frac{p(Z/w_i) \times Pr(w_i)}{\sum_{k=1}^{n} p(Z/w_k) \times Pr(w_k)}$$

where:
- $w_i$: the class C1, C2, C3, i varying from 1 to n, n being equal to 3 in the present example;
- $Pr(w_i)$: the a priori probability; and
- $p(Z/w_i)$: the probability density (for the normal law cited above) specified hereinafter:

B/ measurement probability density:

$$p(Z/w_i) = \frac{1}{\sqrt{(2\pi)^d \times \det(\sigma_i)}} \times e^{-(\frac{1}{2}(Z-\mu_i)^T \sigma_i^{-1}(Z-\mu_i))}$$

where:
- T: indicates the transposed matrix;
- d: the dimension of the input vector;
- $\mu_i$: the moment of order 1 of the class i {i=1 to n];
- $\sigma_i$: the moment of order 2 of the class i;
- $w_i$: the class C1, C2, C3 concerned; and
- Z: the measurement point resulting from an analysis into main components in four dimensions;

C/ general Bayesian condition:

$$\sum_{i=1}^{n} P(w_i/Z) = 1$$

Thus n a posteriori probabilities are obtained whose sum is equal to 1.

If a signal that does not belong to any of the classes C1, C2 and C3 considered is injected at the input, the preceding equation will falsify the calculation since by definition the sum is equal to 1 and consequently the signal will be assigned a class anyway. Also, to avoid this kind of problem, the means 23 employ a rejection strategy that refines the decision and therefore refines overall performance. An object of the rejection strategy is to fix boundaries at the decision space of the database 10 that is five-dimensional, for example. This amounts to creating a volume around the class C1. Bayes' theory gives a posteriori probabilities of which only the maximum probability is taken into account. If that maximum probability corresponds to said class C1 (corona discharge), said rejection strategy is applied, as the estimate may be false.

To be more precise, thanks to this rejection strategy, for the means 23 to assign a shape vector (representative of the measurements carried out on the cable 2) to the corona discharge class C1, it is necessary for all the following conditions to be satisfied:
- the a posteriori probability supplied by Bayes' theorem is at a maximum for the class C1, i.e. $P(w_1/Z) > P(w_2/Z) > P(w_3/Z)$ or $P(w_1/Z) > P(w_3/Z) > P(w_2/Z)$, assuming that the class C1 has the probability $P(W_1/Z)$;
- this latter probability is higher than an ambiguity threshold, namely 0.33 in the case of three classes C1, C2 and C3;
- the probability density of the normal distribution is greater than $2 \times 10^{-4}$; and
- the Mahalanobis distance is less than 0.26.

Said means 23 also apply a thresholding procedure to the corona discharge class C1. If the point considered belongs to the space (or volume) corresponding to the criteria of belonging to the class C1, the means 25 take an appropriate decision. That decision can take several forms, as a function in particular of the degree of progress in time of the phenomenon.

Said means 25 can transmit this decision over a connection 27 to information means 28, for example a visual indicator (lamp), audio indicator or display screen adapted where applicable to inform an operator of the detection of an arcing phenomenon.

Said means 25 can also command a switch 29 automatically over a connection 30 to break automatically the current supplied by said electrical cable 2 that is being monitored to said load 3 in the event of detection of an electrical arcing phenomenon at the level of said electrical cable 2.

Said device 1 further includes electrical power supply means 31 connected by the connection 7 to said electrical cable 2 that is being monitored and supplied with electrical power thereby. The device 1 is therefore supplied with electrical power directly by the electrical cable 2 that is being monitored.

It will further be noted that said database 10 is formed by a training process from measurements carried out on electrical cables subject to different phenomena for which it is required to constitute classes using at least the functions cited above of the acquisition unit 5 and the means 22 and 23.

To constitute said database 10, recordings are effected in the laboratory in order to obtain a set of measurements sufficiently representative of the different classes C1, C2 and C3 considered. The records are subjected to the same mathematical processing as the future measurements for which that database 10 will be used (see above).

The device 1 of the invention uses a classification and rejection mechanism based on a statistic of the signal that can discriminate the electrical arcing phenomenon from external interference. This device 1 has numerous advantages. In particular:
- it detects in real time each arcing phenomenon that occurs on any type of electrical cable 2 as soon as that phenomenon arises;
- it avoids confusing corona discharges with the normal consumption of a load;
- it increases the reliability of the decision-making process and therefore limits the probability of false alarms;
- it increases the sensitivity of electrical arcing detection and therefore protects the integrity of the electrical network; and
- it immunizes the protection function from disturbing phenomena.

Moreover, said device 1 works for direct current and alternating current electrical networks, independently of the frequency of those electrical networks. Said device 1 is also independent of the type of load connected to the network that is being monitored.

The invention claimed is:

1. A method of detecting an electrical arcing phenomenon on at least one electrical cable, wherein:

A/ determining, in a preliminary step, a database comprising a plurality of classes, including a first class relating to a corona discharge phase to be detected and at least one second class relating to phenomena liable to interfere with the detection process; and B/ in a subsequent detection step, successively:

a) in an acquisition phase:

α) carrying out an electrical current measurement and an electrical voltage measurement directly on said electrical cable;

β} filtering said current and voltage measurements obtained in this way; and

γ) digitizing the measurements filtered in this way to form two digitized data segments relating to the electrical current and to the electrical voltage, respectively; and b) in a subsequent processing phase:

α) subjecting each of said segments to a plurality of particular functions each generating a scalar magnitude, the set of scalar magnitudes relating to the current forming a first vector and the set of scalar magnitudes relating to the voltage forming a second vector;

β) determining the class to which said shape vector belongs using said database and a shape vector obtained from said first and second vectors that is representative of the measurements carried out; and γ) concluding that:

an electrical arcing phenomenon exists if said class represents said first class relating to a corona discharge phase; and there is no electrical arcing phenomenon otherwise.

2. The method as claimed in claim 1, wherein in the step B.a.α the current and voltage measurements are carried out in a synchronized fashion.

3. The method as claimed in either claim 1, wherein in the step B.a.β band-pass filtering is effected.

4. The method as claimed in claim 1, wherein the particular functions used in the step B.b.α have the object of extracting interpretable main components of the signal for comparison with said database.

5. The method as claimed in claim 1, wherein said shape vector is obtained by concatenation of said first and second vectors.

6. The method as claimed in claim 1, wherein in the step B.b.β there are determined probabilities of said shape vector belonging to respective classes of said database and in the step B.b.γ it is concluded that an electrical arcing phenomenon exists if at least the following condition is satisfied: the probability of belonging to said first class is higher than the probabilities thus determined.

7. The method as claimed in claim 6, wherein the probabilities are determined with the aid of a Bayesian decision.

8. The method as claimed in claim 6, wherein in the step B.b.γ it is concluded that an electrical arcing phenomenon exists if the following conditions are also satisfied:

the probability of belonging to said first class is above an ambiguity threshold;

a probability density is greater than a predetermined value; and a Mahalanobis distance is less than a predetermined value.

9. The method as claimed in claim 6, wherein in the step B.b.β:

said shape vector is projected into a subspace to obtain a representative point having a reduced number of main components; and this point is projected into spaces representing the classes of the database to obtain the corresponding probabilities of this point belonging to said classes that is representative of the shape vector.

10. The method as claimed in claim 1, wherein said database is formed by a training process in said preliminary step.

11. The method as claimed in claim 10, wherein said database is formed from measurements carried out on electrical cables subject to phenomena for which it is required to constitute classes by implementation of at least said steps B.a.α, B.a.β, B.a.γ and B.b.α.

12. A device for detecting an electrical arcing phenomenon on at least one electrical cable, wherein it includes at least:

a database comprising a plurality of classes including a first class relating to a corona discharge phase to be detected and at least one second class relating to phenomena liable to interfere with the detection process, a first means for carrying out an electrical current measurement and an electrical voltage measurement directly on said electrical cable;

second means for filtering said current and voltage measurements;

third means for digitizing the filtered measurements to form two digitized data segments relating to the electrical current and to the electrical voltage, respectively;

fourth means for subjecting each of said segments to a plurality of particular functions each generating a scalar magnitude, the set of scalar magnitudes relating to the current forming a first vector and the set of scalar magnitudes relating to the voltage forming a second vector;

fifth means for determining the class to which a shape vector obtained from said first and second vectors and representative of the measurements carried out by said first means belongs using said database; and means for deducing the existence or nonexistence of an electrical arcing phenomenon from the result of the processing carried out by said fifth means.

13. The device as claimed in claim 12, wherein it further includes electrical power supply means connected to said electrical cable that is being monitored and supplied with electrical power thereby.

14. The device as claimed in claim 12, wherein it further includes a switching unit adapted to interrupt the current supplied by said electrical cable that is being monitored automatically in the event of detection of an electrical arcing phenomenon.

* * * * *